(12) United States Patent
Koons et al.

(10) Patent No.: US 7,498,831 B2
(45) Date of Patent: Mar. 3, 2009

(54) CONDUCTION-COOLED ACCELERATED TEST FIXTURE

(75) Inventors: Micah S. Koons, Plano, TX (US); Donald R. Tolbert, McKinney, TX (US); Mark A. Taylor, McKinney, TX (US); Scott J. Martin, Richardson, TX (US)

(73) Assignee: Raytheon Company, Waltham, MA (US)

( * ) Notice: Subject to any disclaimer, the term of this patent is extended or adjusted under 35 U.S.C. 154(b) by 344 days.

(21) Appl. No.: 11/278,765

(22) Filed: Apr. 5, 2006

(65) Prior Publication Data

US 2007/0255361 A1 Nov. 1, 2007

(51) Int. Cl.
*G01R 31/02* (2006.01)
*G01R 31/26* (2006.01)

(52) U.S. Cl. ............................. 324/760; 324/765

(58) Field of Classification Search ................ 324/760, 324/765, 158.1, 763; 62/223, 3.3, 3, 5, 3.7; 219/632, 623, 757, 61.7, 76.11, 86.31, 120, 219/121.33, 121.49, 137.62, 208, 531; 165/255, 165/253, 80.2
See application file for complete search history.

(56) References Cited

U.S. PATENT DOCUMENTS

| | | | |
|---|---|---|---|
| 5,077,523 A | 12/1991 | Blanz | 324/158 |
| 5,166,607 A | 11/1992 | Long | 324/158 |
| 5,450,018 A | 9/1995 | Rieser et al. | 324/760 |
| 5,744,975 A | 4/1998 | Notohardjono et al. | 324/760 |
| 6,668,570 B2 * | 12/2003 | Wall et al. | 62/223 |
| 6,771,086 B2 * | 8/2004 | Lutz et al. | 324/760 |
| 7,015,712 B1 | 3/2006 | Liu | 324/760 |
| 2004/0178808 A1 | 9/2004 | Fenk | 324/703 |

FOREIGN PATENT DOCUMENTS

DE   197 47 399 A1   5/1999
EP   0 611 968 A1   1/1994

OTHER PUBLICATIONS

European Search Report; Reference No. JL38114P.EPP; Application No./Patent No. 07250936.7-1524; 12 pages, Aug. 20, 2007.

* cited by examiner

*Primary Examiner*—Ha Tran T Nguyen
*Assistant Examiner*—Tung X Nguyen
(74) *Attorney, Agent, or Firm*—Baker Botts L.L.P.

(57) ABSTRACT

According to one embodiment of the invention, a testing apparatus for executing highly accelerated life testing on at least one test subject including at least one structure operable to thermally stress the test subject via conduction and at least one pneumatic hammer operable to input imparting vibrations to the test subject. According to another embodiment of the invention, a method for executing highly accelerated life testing of at least one test subject via conduction at a rate of change of at least 8 ° C. per minute and imparting vibrations to the test subject at a rate of at least 3Gs rms.

3 Claims, 4 Drawing Sheets

CONDUCTION-COOLED ACCELERATED TEST FIXTURE

GOVERNMENT FUNDING

This invention was made with Government support under contract N00019-02-C-3002 awarded by the Department of the Navy. The Government has certain rights in this invention.

TECHNICAL FIELD OF THE INVENTION

This invention relates generally to the field of highly-accelerated life testing (HALT) fixtures and, more particularly, to a conduction-cooled accelerated test fixture.

BACKGROUND OF THE INVENTION

It is important for a manufacturer to test its products before releasing them to the public to ensure that the products function reliably when released. Faulty or dysfunctional products can often cause consumer confidence in the manufacturer to decrease, and in addition, can have costly repercussions for the manufacturer consisting of, among other things, product recalls, product liability suits, and the like. However, thorough testing of consumer products can be realized through the use of HALT fixtures.

HALT fixtures are designed to test products to uncover design defects and weaknesses in electronic and electromechanical assemblies by applying extreme vibrational and thermal stresses to the product. The thermal stresses can consist of rapid and extreme temperature changes. Through the application of such stresses to a product during HALT testing, the HALT fixture can emulate in a brief time frame (i.e., a few days or hours) the entire lifetime of stresses that a product will typically undergo during conventional use.

SUMMARY OF THE INVENTION

According to one embodiment of the invention, a testing apparatus for executing highly accelerated life testing on at least one test subject includes at least one structure operable to thermally stress the test subject via conduction and at least one pneumatic hammer operable to input imparting vibrations to the test subject. According to another embodiment of the invention, a method for executing highly accelerated life testing of at least one test subject includes applying a thermal stress to the test subject via conduction at a rate of change of at least 8° C. per minute and imparting vibrations to the test subject at a rate of at least 3Gs rms.

Certain embodiments of the invention may provide numerous technical advantages. For example, a technical advantage of one embodiment may include the reduction of overlooked design flaws or weaknesses, which reduction results from more accurate emulation of the test subject's thermal environment during HALT testing. An additional technical advantage of this embodiment and/or of an alternate embodiment may include chamber-free HALT testing.

Although specific advantages have been enumerated above, various embodiments may include all, some, or none of the enumerated advantages. Additionally, other technical advantages may become readily apparent to one of ordinary skill in the art after review of the following figures and description.

BRIEF DESCRIPTION OF THE DRAWINGS

For a more complete understanding of example embodiments of the present invention and its advantages, reference is now made to the following description, taken in conjunction with the accompanying drawings, in which.

DETAILED DESCRIPTION

It should be understood at the outset that although example embodiments of the present invention are illustrated below, the present invention may be implemented using any number of techniques, whether currently known or in existence. The present invention should in no way be limited to the example embodiments, drawings, and techniques illustrated below, including the embodiments and implementation illustrated and described herein. Additionally, the drawings are not necessarily drawn to scale.

Figure 1:
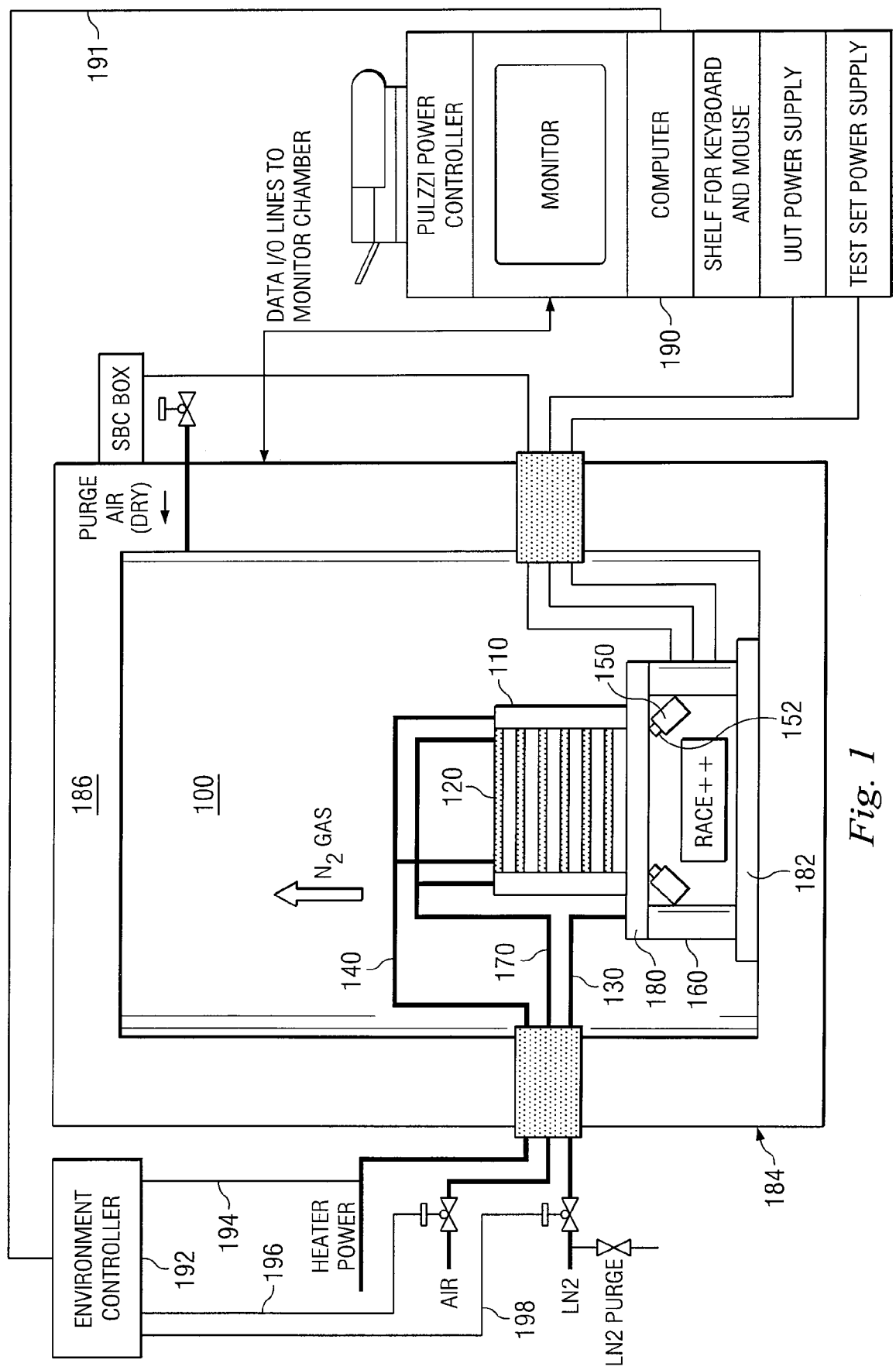
FIG. 1 is a schematic diagram of an example embodiment of a testing apparatus housed inside of a chamber.

FIG. 1 is a schematic diagram of an example embodiment of a testing apparatus 100 housed inside of a chamber 184. The testing apparatus 100 is operable to stress a test subject 120 by applying either or both of a thermal stress and vibrational stress to the test subject 120. The test subject 120 can include one or more electrical circuit cards or other electrical components. In one example implementation, the test subject 120 is a circuit card that contains a protective cover; however, test configuration apparatus 100 may be used with a variety of types of test subjects.

The testing apparatus 100 includes, in this embodiment, a pair of structures 110 for thermally stressing the test subject 120 via conduction heating and/or conduction cooling. In this embodiment, structures 110 are referred to as rails 110 and are illustrated in greater detail in FIGS. 2 through 3D. Conduction heating and/or conduction cooling of the test subject 120 occurs by first heating and/or cooling the rails 110, which then conduction heat and/or conduction cool the test subject 120. In one embodiment, the rails 110 abut the edges of test subject 120, which allows the heating and/or cooling by conduction to take place.

Conduction cooling may take place, in one embodiment, by first introducing liquid nitrogen ($LN_2$) into a pipe 130; however, other cooling fluids may be utilized.

Previous HALT systems cooled and/or heated a test subject by convection, blowing cold and/or hot air over the test subject. Convection cooling, however, is not effective when testing a high-powered rail-cooled test subject because convection cooling does not accurately simulate the environment that the test subject is exposed to in the field. In particular, certain temperature gradients that the test subject is exposed to in the field cannot be recreated in a test setting by blowing cold and/or hot air over the test subject. In contrast, thermal stress testing of the test subject by conduction cooling and/or conduction heating more accurately simulates the environment that the test subject is exposed to in the field. Additionally, cooling and/or heating by conduction, as opposed to convection, in one embodiment, maintains a dry nitrogen atmosphere around the test subject, thereby eliminating potential electrical shorts due to moisture condensation.

Referring back to FIG. 1, the $LN_2$ flows through the pipe 130 and enters the rails 110 through openings at the bottom of the rails 110. After entering the rails 110, the LN$_2$ flows throughout channels inside of the rails 110, as is illustrated in, and described in greater detail in conjunction with, FIGS. 3C and 3D. As the LN$_2$ flows through the internal channels of the rails 110, the LN$_2$ evaporates, thereby causing the rails 110 to lose heat. Because the edges of test subject 120 abut the rails 110, the heat loss experienced by the test subject 120 is transferred to the rails 110, thereby conduction cooling the test subject 120. After the LN$_2$ evaporates, the nitrogen gas exits the rails and vents across the test subject 120. This process will be further described in connection with FIG. 3A. It is noted that, in one embodiment, neither the LN$_2$ nor the nitrogen gas comes into contact with the electrical components of the card. Conduction cooling the test subject 120 provides a benefit of more accurately emulating the thermal environment of the test subject 120.

Figure 2:
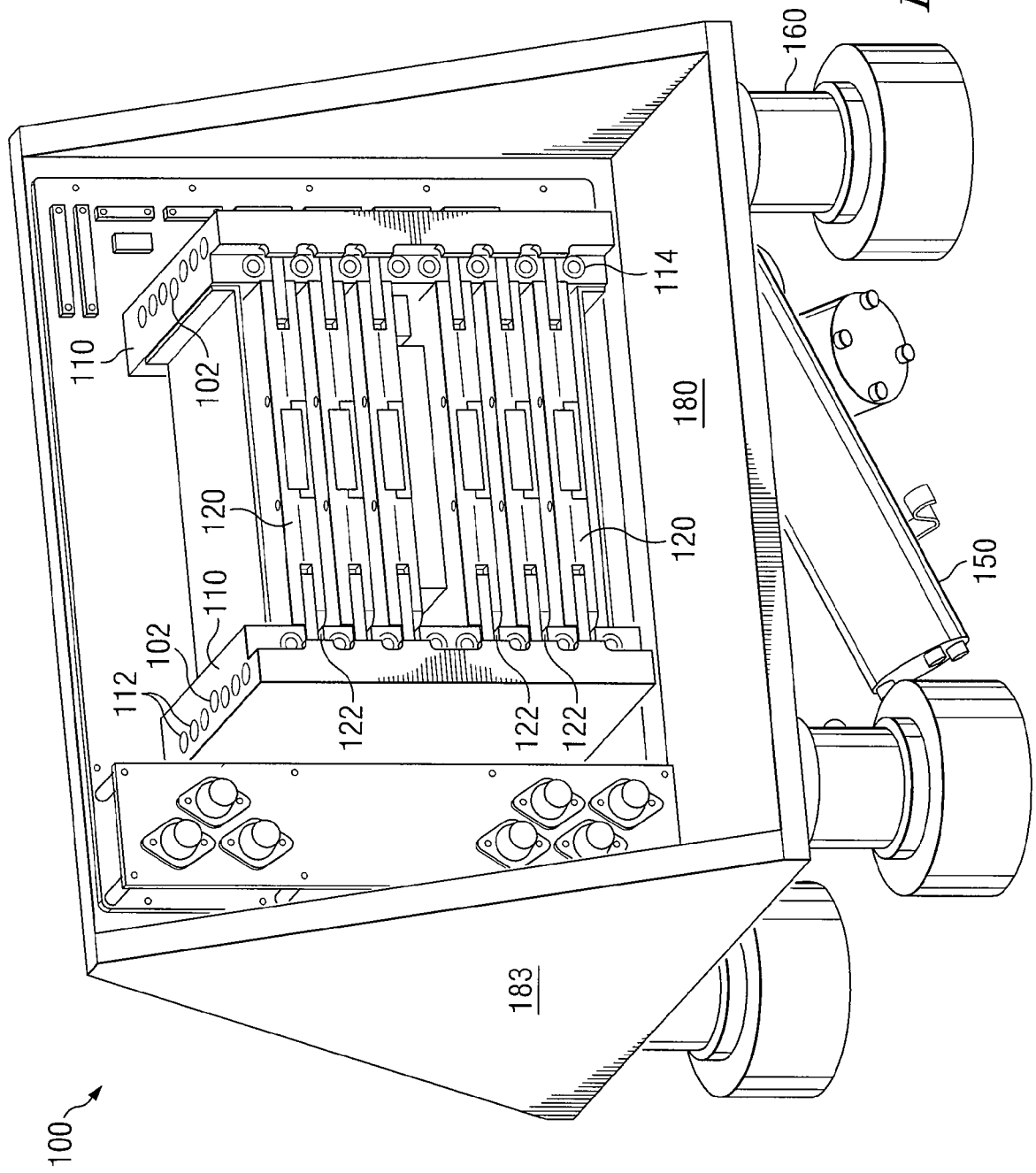
FIG. 2 is an illustration of the testing apparatus of FIG. 1.

Conduction heating of the test subject 120 can take place by introducing one or more heated rods 172 into respective openings 112 in the rails 110, as illustrated in FIG. 2. The rods 172 may include cartridge heaters, or other types of heaters. Referring back to FIG. 1, power is provided to the heated rods through a line 140. When powered, the heated rods heat by conduction the rails 110. Because the edges of the test subject 120 abut the rails 110, heat is transferred to the test subject 120 through conduction.

Additionally, the testing apparatus 100 vibrationally stresses the test subject 120. Vibrational stress is generated, in one embodiment, by one or more pneumatic hammers 150 that are attached at one end 152 to the bottom of a base plate 180 upon which the rails 110 are fitted. The other end of each pneumatic hammer 150 is left unattached so that it can impart vibrations to the testing apparatus 100 when air is supplied to the pneumatic hammers 150. The air that drives the pneumatic hammers 150 may be supplied to the testing apparatus 100 via pipe 170. The testing apparatus 100 is fitted with shock mounts 160 between the base plate 180 and the base 182 of the testing apparatus 100 for dampening the vibrations generated by the pneumatic hammers 150, in one embodiment.

In one embodiment of the invention, the testing apparatus 100 is housed inside of a chamber 184. Chamber 184 includes walls 186 that act as sound proofing, dampening the sound generated by the testing apparatus 100. Although one embodiment of the testing apparatus 100 utilizes a chamber 184 as a housing, the testing apparatus 100 can be operated without such a chamber 184, as can be seen in FIG. 2.

A computer 190 controls the test settings of the testing apparatus 100. Computer 190 controls the test settings of the testing apparatus 100 by transmitting signals through a line 191 to an environment controller 192. Environment controller 192, in turn, controls the heating, shaking, as well as cooling of the test subject 120 via control lines 194, 196, and 198 respectively. Computer 190 may also receive test results from the testing apparatus 100 while thermal and vibrational stresses are applied to the test subject 120. Additional details of test configuration apparatus 100 are described in conjunction with FIGS. 2 through 3D.

FIG. 2 is an illustration of selected portions of test configuration apparatus 100. The frame of the configuration apparatus 100 includes structural support 183 and the base plate 180. In this embodiment, the test subject 120 includes a plurality of circuit cards. The circuit cards are held in place by card guides 122, which can be seen more clearly in FIG. 3A. The card guides 122 are also the location where the rails 110 abut the test subject 120 and thus are the location where conduction heating and/or conduction cooling of the test subject 120 takes place.

With respect to conduction cooling, the LN$_2$ is piped into the rails 110 through openings on the bottom of the rails 110. This will be illustrated more clearly in FIG. 3D. Once the LN$_2$ enters the rails 110, it flows through various circular channels emptying into central channels, which extend the entire height of the rails 110, in this embodiment. This will be illustrated more clearly in FIG. 3C. Openings 102 of the central channels are illustrated in FIG. 2 as the center openings in the top surface of the rails 110, which openings 102 are flanked on two sides by three openings 112 for receiving the heated rods. From the central channels, the LN$_2$ flows into the cooling tubes, the openings 114 of which can be seen in FIG. 2. The cooling tubes extend the full length of the rails 110 and will be illustrated more clearly in FIG. 3A. The cooling tubes are the location where the LN$_2$ evaporates, thus conduction cooling the rails 110 and the card guides 122 which conduction cool the test subject 120. Variable-sized plugs can be inserted into the openings 114 of the cooling tubes, providing a means for adjusting the amount of cooling of the test subject 120. In one embodiment, because each opening 114 is associated with a specific card guide 122, the temperature of each circuit card can be controlled independently from the others.

Figure 3B:
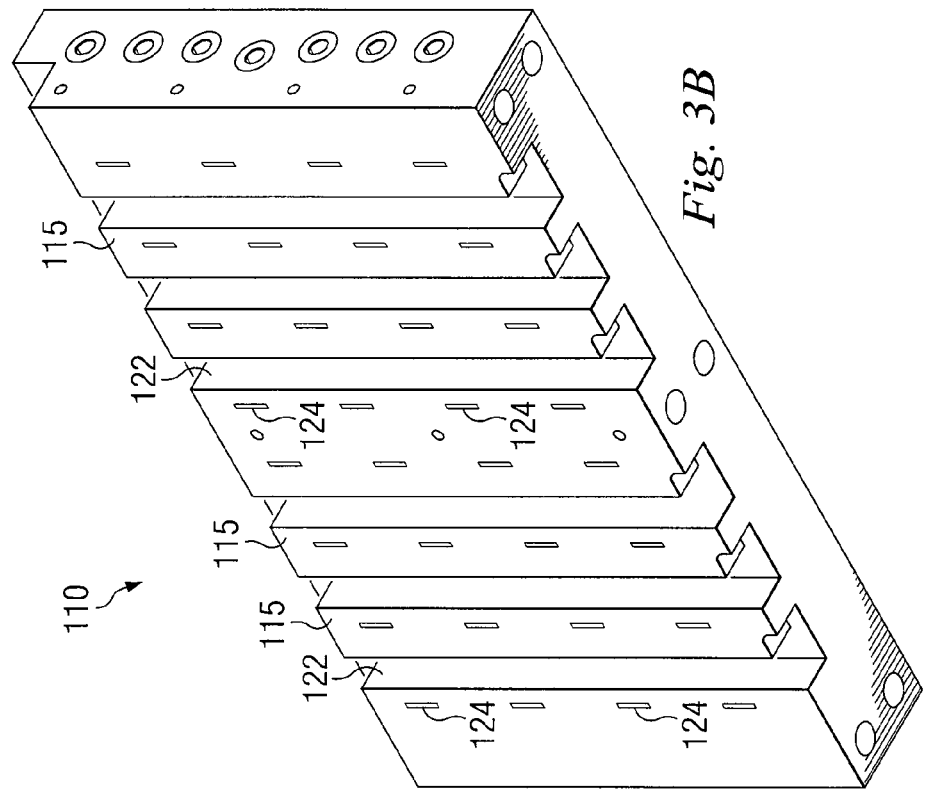
FIG. 3B is an illustration of an alternate view of the inner face of the rail of FIG. 3A.
Figure 3A:
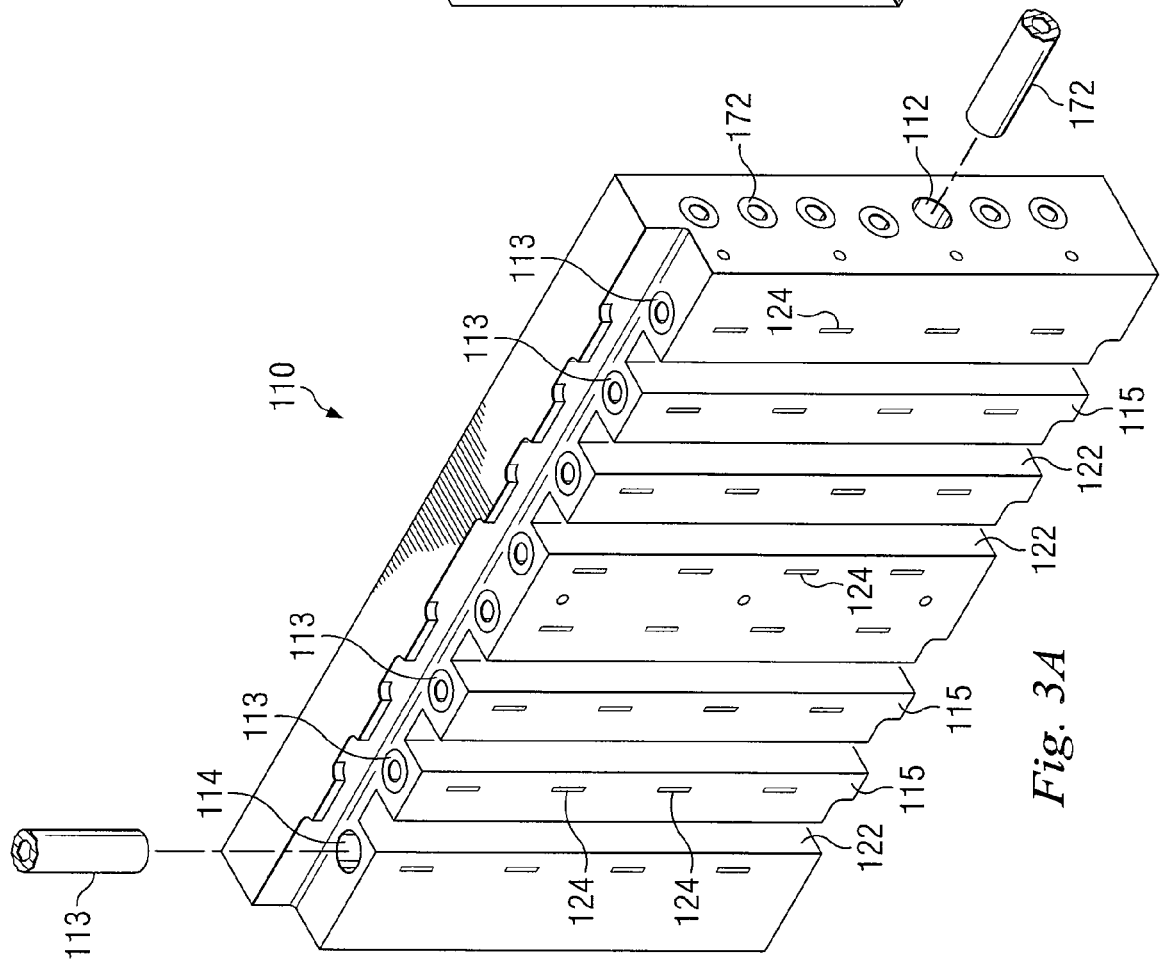
FIG. 3A is an illustration of the inner face of a rail of the testing apparatus of FIG. 1.

FIG. 3A is an illustration of the inner face of the rail 110 of the test configuration apparatus. The rail 110 consists of the card guides 122 into which the test subject is inserted. As mentioned in FIG. 2, the card guides 122 are conduction cooled by evaporation of the LN$_2$ in the cooling tubes 113 within columns 115. Variable-sized plugs can be inserted into the openings 114 of the cooling tubes 113 in order to control the amount of cooling of the test subject. Notches 124 in the rail 110 are openings from which the nitrogen gas vents after cooling the rail 110 and the card guides 122. With respect to conduction heating, the heated rods mentioned in connection with FIG. 1 can be inserted into the openings 112 to the heating tubes in the rail 110.

FIG. 3B is an illustration of an alternate view of the inner face of the rail 110 of the test configuration apparatus.

Figure 3C:
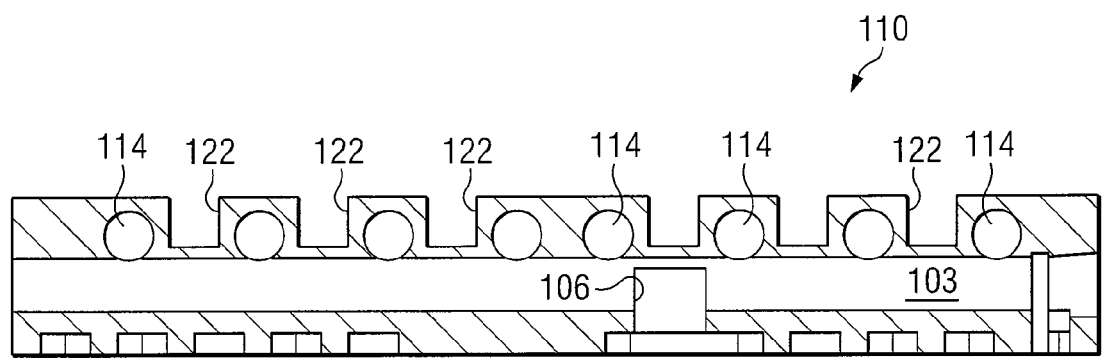
FIG. 3C is a schematic diagram of a vertical cross-section of the short side of the rail of FIG. 3A.

The conduction cooling of the rails will be described in more detail in FIGS. 3C and 3D. FIG. 3C is a schematic diagram of a vertical cross-section of the short side of the rail 110.

Figure 3D:
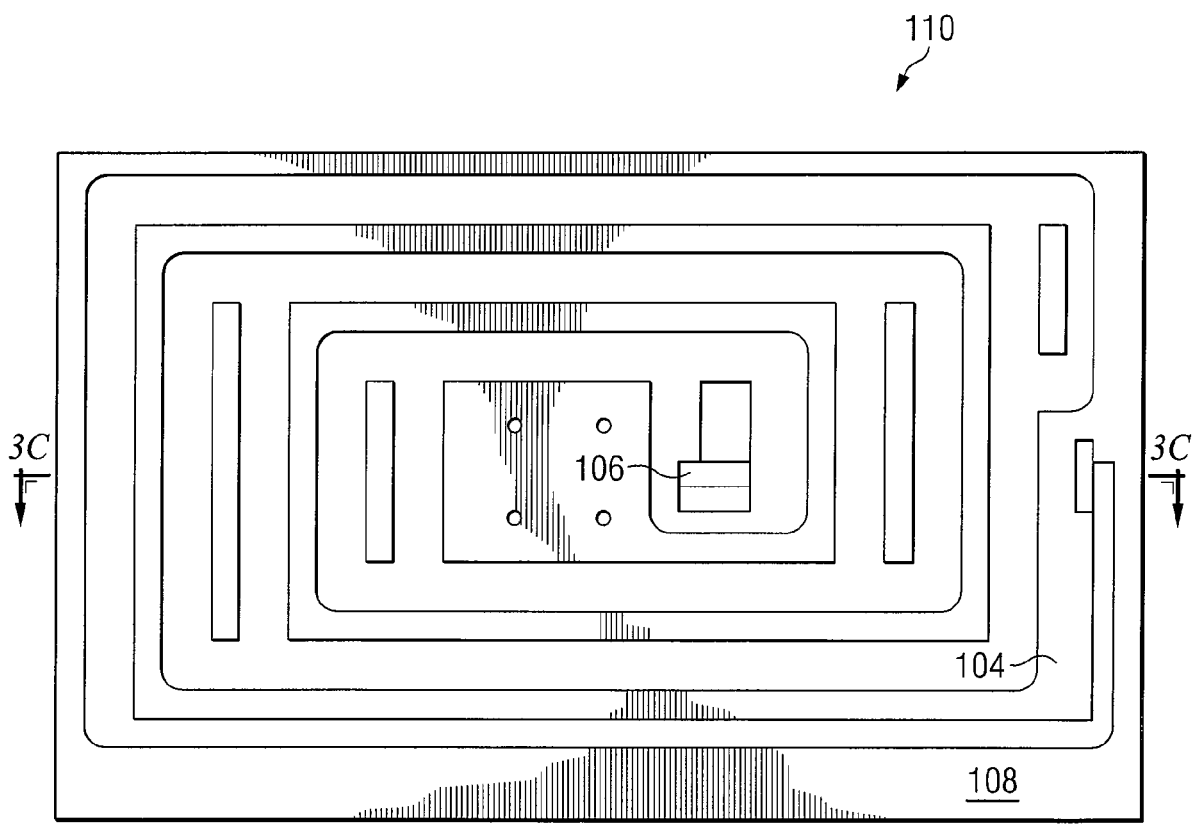
FIG. 3D is a schematic diagram of a vertical cross-section of the long side of the rail of FIG. 3A.

FIG. 3D is a schematic diagram of a vertical cross-section of the long side of the rail 110. When thermally stressing the test subject by conduction cooling, LN$_2$ enters the rail 110 through slot 108. The LN$_2$ is then circulated through the rail 110 via the circular channels 104 until it reaches the opening 106 to the central channel 103. The LN$_2$ flows into the central channel 103, which then distributes the LN$_2$ to each of the vertical cooling tubes 113. As the LN$_2$ flows through the various channels, it evaporates, conduction cooling the rail 110 and card guides 122, which conduction cools the test subject.

The teachings of the invention described hereinabove are applicable to testing purposes other than HALT, such as Highly Accelerated Stress Screening (HASS).

Numerous other changes, substitutions, variations, alterations and modifications may be ascertained by those skilled in the art and it is intended that the present invention encompass all such changes, substitutions, variations, alterations and modifications as falling within the spirit and scope of the appended claims.

What is claimed is:

1. A testing apparatus for executing testing on at least one test subject, comprising:

a first set of channels for cooling the at least one test subject by conduction, comprising:

at least one first cooling channel operable to receive a supply of liquid nitrogen and further operable to distribute the supply of liquid nitrogen to at least one second cooling channel;

the at least one second cooling channel, connected to the at least one first cooling channel, operable to receive the supply of liquid nitrogen from the at least one first cooling channel and further operable to distribute the supply of liquid nitrogen to at least one third cooling channel; and the at least one third cooling channel, connected to the at least one second cooling channel, operable to receive the supply of liquid nitrogen from the at least one second cooling channel and further operable to cool by conduction a structure that is operable to cool by conduction the test subject; and a second set of channels for heating the at least one test subject by conduction, comprising:

at least one first heating channel operable to receive at least one heating rod and further operable to heat by conduction a structure that is operable to heat by conduction the at least one test subject.

2. The testing apparatus of claim 1, wherein the at least one third cooling channel is at least substantially perpendicular to the at least one first heating channel.

3. The testing apparatus of claim 1, wherein the at least one third cooling channel comprises:

vents operable to allow nitrogen gas to exit from the at least one third cooling channel; and openings operable to regulate the cooling of the structure that is operable to cool by conduction the at least one test subject.

* * * * *

UNITED STATES PATENT AND TRADEMARK OFFICE
CERTIFICATE OF CORRECTION

PATENT NO. : 7,498,831 B2 Page 1 of 1
APPLICATION NO. : 11/278765
DATED : March 3, 2009
INVENTOR(S) : Micah S. Koons et al.

It is certified that error appears in the above-identified patent and that said Letters Patent is hereby corrected as shown below:

<u>Title Page at Abstract:</u>

Line 3, after "test subject" delete "including" and insert -- includes --.

Line 8, after "test subject" insert -- includes applying a thermal stress to the test subject --.

Signed and Sealed this

Thirtieth Day of June, 2009

JOHN DOLL
*Acting Director of the United States Patent and Trademark Office*